(12) United States Patent
Wang et al.

(10) Patent No.: US 9,412,794 B2
(45) Date of Patent: Aug. 9, 2016

(54) OLED DISPLAY PANEL

(71) Applicant: Ye Xin Technology Consulting Co., Ltd., Hsinchu (TW)

(72) Inventors: Wei-Li Wang, Hsinchu (TW); Chang-Ting Lin, Hsinchu (TW); Chun-Chieh Huang, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 160 days.

(21) Appl. No.: 14/037,397

(22) Filed: Sep. 26, 2013

(65) Prior Publication Data

US 2015/0035731 A1 Feb. 5, 2015

(30) Foreign Application Priority Data

Aug. 5, 2013 (TW) .............................. 102127955 A

(51) Int. Cl.
*G09G 3/32* (2016.01)
*H01L 27/32* (2006.01)

(52) U.S. Cl.
CPC .... *H01L 27/3218* (2013.01); *G09G 2300/0452* (2013.01)

(58) Field of Classification Search
CPC ... G09G 3/32; G09G 3/36; G09G 2300/0452; F21S 2/00; F21S 13/14; F21V 5/00; G02B 6/04; H01J 1/54; H01L 27/3218
See application file for complete search history.

(56) References Cited

U.S. PATENT DOCUMENTS

| | | | |
|---|---|---|---|
| 6,219,015 B1 * | 4/2001 | Bloom et al. | 345/87 |
| 6,892,014 B2 * | 5/2005 | Cok et al. | 385/120 |
| 2008/0239718 A1 * | 10/2008 | Huttner et al. | 362/231 |
| 2010/0259165 A1 * | 10/2010 | Miura | 313/505 |

FOREIGN PATENT DOCUMENTS

| | | |
|---|---|---|
| CN | 101449382 A | 6/2009 |
| CN | 102855820 A | 1/2013 |
| TW | I402539 B | 9/2005 |
| TW | 200606769 A | 5/2011 |

* cited by examiner

*Primary Examiner* — Lun-Yi Lao
*Assistant Examiner* — Johny Lau
(74) *Attorney, Agent, or Firm* — ScienBiziP, P.C.

(57) ABSTRACT

An organic light emitting diode (OLED) display panel includes a plurality of pixels spaced from each other. Each of the pixels includes a first sub-pixel, a second sub-pixel, and a third sub-pixel. The first sub-pixel, the second sub-pixel, and the third sub-pixel of each pixel are all rhombus shaped. The first sub-pixel, the second sub-pixel, and the third sub-pixel spaced from each other by three barriers. The three barriers are connected with each other in a Y-shaped pattern. An angle defined by two adjacent barriers is about 120 degrees.

12 Claims, 3 Drawing Sheets ately adjacent to each other. An angle defined by two adjacent barriers 24 is about 120 degrees. Each pixel 20 is surrounded by six adjacent pixels 20.

OLED DISPLAY PANEL

BACKGROUND

1. Technical Field

The present disclosure relates to an OLED (organic light emitting diode) display panel.

2. Description of Related Art

OLEDs (organic light emitting diodes) are in development for use in displays. An OLED display panel includes a plurality of pixels. Referring to FIG. 1, each pixel includes three sub-pixels composed of red, green, and blue colors, to generate a color image. For higher pixel density, the arrangement of the sub-pixels must be more compact, thereby increasing the burden of manufacturing the OLED display panel.

Therefore, an OLED display panel capable of overcoming the above described shortcomings is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
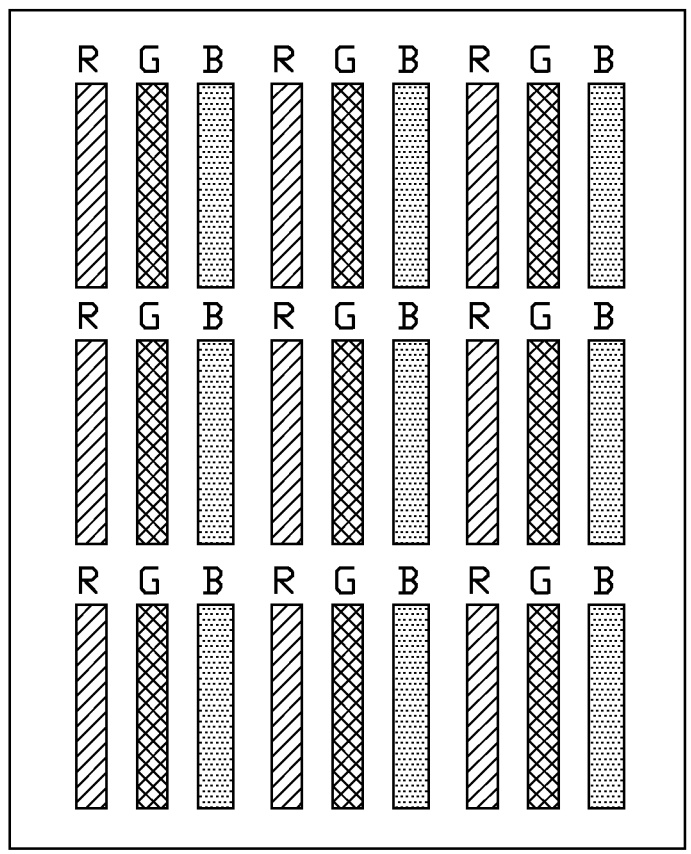
FIG. 1 shows a schematic view of a traditional OLED display panel.
Figure 2:
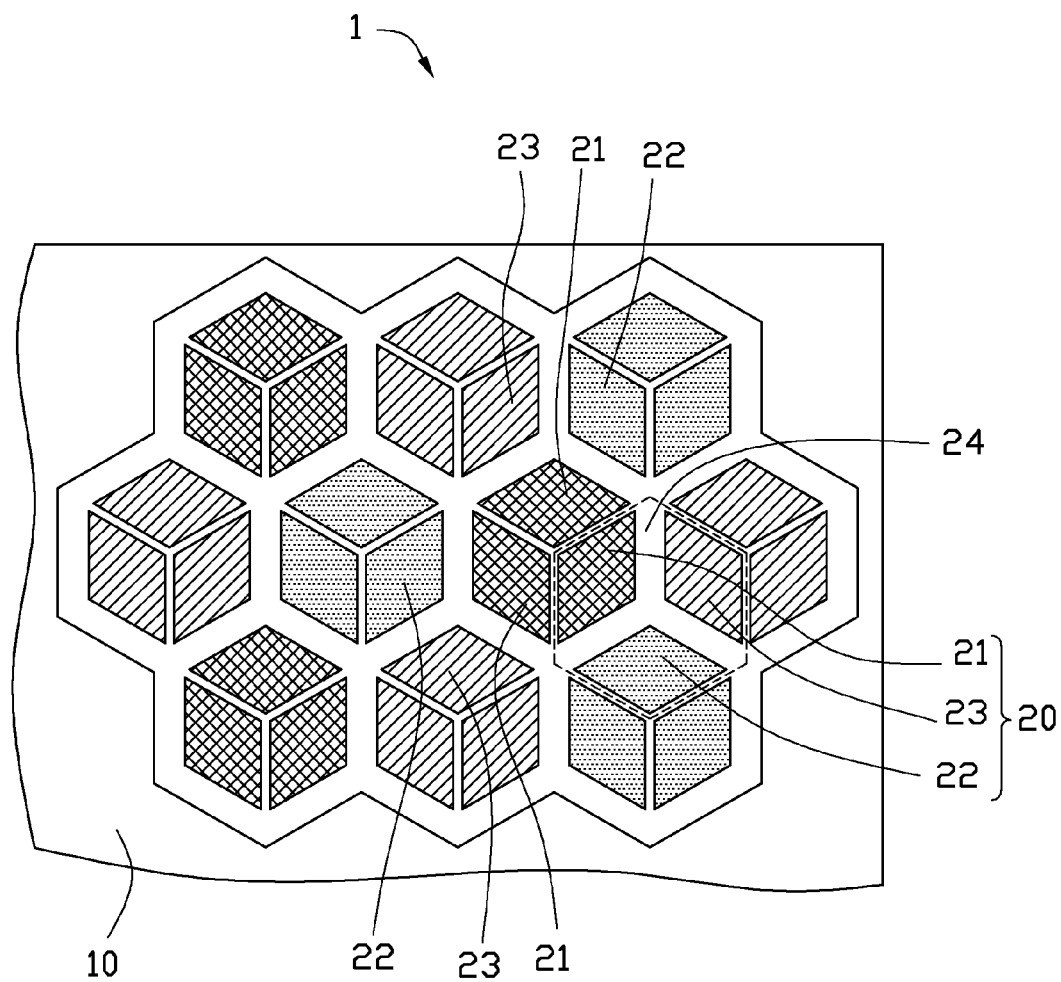
FIG. 2 shows a schematic view of an OLED display panel in accordance with an embodiment of the present disclosure.

Referring to FIG. 2, an embodiment of an OLED display panel 1 includes a base 10 and a plurality of pixels 20 formed on the base 10. The plurality of pixels 20 are spaced from each other. Each of the pixels 20 includes a first sub-pixel 21, a second sub-pixel 22, and a third sub-pixel 23. The first sub-pixel 21, the second sub-pixel 22, and the third sub-pixel 23 are spaced from each other. In this embodiment, the first sub-pixel 21 is a green sub-pixel, the second sub-pixel 22 is a blue sub-pixel, and the third sub-pixel 23 is a red sub-pixel.

Each pixel 20 is in a shape of a regular hexagon. The first sub-pixel 21, the second sub-pixel 22 and the third sub-pixel 23 of each pixel 20 are all rhombus shaped. In this embodiment, the first sub-pixel 21 of a first pixel 20, the second sub-pixel 22 of a second pixel 20, and the third sub-pixel 23 of a third pixel 20 are spaced from each other by three barriers 24 and collectively form another hexagon. The three barriers 24 are connected with each other in a Y-shaped pattern. The first pixel 20, the second pixel 20, and the third pixel 20 are immediately adjacent to each other. An angle defined by two adjacent barriers 24 is about 120 degrees. Each pixel 20 is surrounded by six adjacent pixels 20.

In three pixels 20 adjacent to each other, the first sub-pixel 21 of one pixel 20 is adjacent to and spaced from the two first sub-pixels 21 of the other two adjacent pixels 20, the second sub-pixel 22 of one pixel 20 is adjacent to and spaced from the two second sub-pixels 22 of the other two adjacent pixels 20, and the third sub-pixel 23 of one pixel 20 is adjacent to and spaced from the two third sub-pixels 23 of the other two adjacent pixels 20. The three first sub-pixels 21 of the three pixels 20 collectively form a hexagon shape with a distance between each of these first sub-pixels 21 being less than a width of the barrier 24. Similarly, the three second sub-pixels 22 of the three pixels 20 collectively form a hexagon shape with a distance between each of these second sub-pixels 22 being less than the width of the barrier 24. Lastly, the three third sub-pixels 23 of the three pixels 20 collectively form a hexagon shape with a distance between each of these third sub-pixels 23 being less than the width of the barrier 24.

Because a distance between the adjacent pixels 20 is less than the width of the barrier 24, the resolution of the OLED display panel 1 is accordingly increased. Furthermore, the sub-pixels with the same color can be manufacturing in one chamber by evaporation process, whereby causes the manufacturing of the OLED display panel 1 to be more comfortable.

Figure 3:
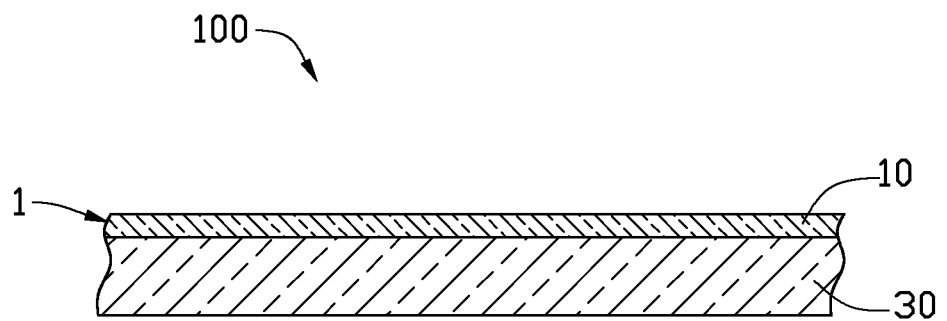
FIG. 3 shows a cross-sectional view of a display module in accordance with an embodiment of the present disclosure.

Referring to FIG. 3, the OLED display panel 1 can also be used in display module 100. The display module 100 includes a backlight module 30 and the OLED display panel 1 located on a top surface of the backlight module 30, and the base 10 of the OLED display panel 1 is attached to the backlight module 30.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An organic light emitting diode (OLED) display panel, comprising a plurality of pixels spaced from each other, wherein each of the pixels comprises a first sub-pixel, a second sub-pixel, and a third sub-pixel; the first sub-pixel, the second sub-pixel, and the third sub-pixel of each pixel are rhombus shaped; the first sub-pixel, the second sub-pixel, and the third sub-pixel are spaced from each other by three barriers; the three barriers are connected with each other in a Y-shaped pattern; each two adjacent of the three barriers define an angle which is about 120 degrees; the first sub-pixel is a green sub-pixel, the second sub-pixel is a blue sub-pixel; and the third sub-pixel is a red sub-pixel; each pixel is in a shape of a regular hexagon; and an arrangement of three adjacent first sub-pixels of three pixels adjacent to each other is in a shape of a regular hexagon.

2. The OLED display panel of claim 1, wherein a distance between the two adjacent first sub-pixels is less than a width of the barrier.

3. The OLED display panel of claim 1, wherein an arrangement of three adjacent second sub-pixels of three pixels adjacent to each other is in a shape of a regular hexagon.

4. The OLED display panel of claim 3, wherein a distance between the two adjacent second sub-pixels is less than a width of the barrier.

5. The OLED display panel of claim 1, wherein an arrangement of three adjacent third sub-pixels of three pixels adjacent to each other is in a shape of a regular hexagon.

6. The OLED display panel of claim 5, wherein a distance between the two adjacent third sub-pixels is less than a width of the barrier.

7. A display module, comprising
an organic light emitting diode (OLED) display panel located on a top surface of the backlight module;
wherein the OLED display panel comprises a base and a plurality of pixels formed on the base, the plurality of pixels are spaced from each other, each of the pixels comprises a first sub-pixel, a second sub-pixel, and a third sub-pixel; the first sub-pixel, the second sub-pixel, and the third sub-pixel of each pixel are rhombus shaped; the first sub-pixel, the second sub-pixel, and the third sub-pixel are spaced from each other by three barriers; the three barriers are connected with each other in a Y-shaped pattern; each two adjacent of the three barriers define an angle which is about 120 degrees; the first sub-pixel is a green sub-pixel, the second sub-pixel is a blue sub-pixel; each pixel is in a shape of a regular hexagon; and an arrangement of three adjacent first sub-pixels of three pixels adjacent to each other is in a shape of a regular hexagon.

8. The display module of claim 7, wherein a distance between the two adjacent first sub-pixels is less than a width of the barrier.

9. The display module of claim 7, wherein an arrangement of three adjacent second sub-pixels of three pixels adjacent to each other is in a shape of a regular hexagon.

10. The display module of claim 9, wherein a distance between the two adjacent second sub-pixels is less than a width of the barrier.

11. The display module of claim 7, wherein an arrangement of three adjacent third sub-pixels of three pixels adjacent to each other is in a shape of a regular hexagon.

12. The display module of claim 11, wherein a distance between the two adjacent third sub-pixels is less than a width of the barrier.

* * * * *